(12) United States Patent
Morita

(10) Patent No.: US 8,879,041 B2
(45) Date of Patent: Nov. 4, 2014

(54) LIQUID CRYSTAL DISPLAY DEVICE

(71) Applicant: Shin Morita, Kanazawa (JP)

(72) Inventor: Shin Morita, Kanazawa (JP)

(73) Assignee: Japan Display Inc., Tokyo (JP)

(*) Notice: Subject to any disclaimer, the term of this patent is extended or adjusted under 35 U.S.C. 154(b) by 96 days.

(21) Appl. No.: 13/747,723

(22) Filed: Jan. 23, 2013

(65) Prior Publication Data

US 2013/0194532 A1    Aug. 1, 2013

(30) Foreign Application Priority Data

Jan. 26, 2012    (JP) .................................. 2012-014144

(51) Int. Cl.
  *G02F 1/1343*    (2006.01)
  *G02F 1/1345*    (2006.01)
  *G02F 1/1362*    (2006.01)

(52) U.S. Cl.
  CPC .... *G02F 1/1343* (2013.01); *G02F 2001/13629* (2013.01); *G02F 1/1345* (2013.01); *G02F 1/13458* (2013.01)
  USPC ............ 349/152; 349/141; 349/150; 349/151

(58) Field of Classification Search
  USPC ................................................ 349/149–152
  See application file for complete search history.

(56) References Cited

U.S. PATENT DOCUMENTS

2006/0146256 A1    7/2006    Ahn

FOREIGN PATENT DOCUMENTS

| JP | 6-202153 A | 7/1994 |
|---|---|---|
| JP | 2001-354968 A | 12/2001 |
| JP | 2006-189775 A | 7/2006 |
| JP | 2006-338013 A | 12/2006 |
| JP | 2007-322563 A | 12/2007 |
| JP | 2008-310210 A | 12/2008 |
| JP | 2010-256517 | 11/2010 |

OTHER PUBLICATIONS

Office Action issued May 7, 2014 in Japanese Patent Application No. 2012-014144 with English language translation.

*Primary Examiner* — Phu Vu
(74) *Attorney, Agent, or Firm* — Oblon, Spivak, McClelland, Maier & Neustadt, L.L.P.

(57) ABSTRACT

According to one embodiment, a liquid crystal display device includes a first substrate including an insulative substrate, a first electrically conductive layer, a second electrically conductive layer, a third electrically conductive layer, a fourth electrically conductive layer. The first electrically conductive layer includes a gate line located on the insulative substrate, a common potential line and a first pad portion. The second electrically conductive layer includes a common electrode which is located on the insulative substrate and is put in contact with the common potential line, and a second pad portion stacked on the first pad portion. The fourth electrically conductive layer includes a pixel electrode in which a slit facing the common electrode is formed, and a third pad portion which is put in contact with the second pad portion.

13 Claims, 6 Drawing Sheets

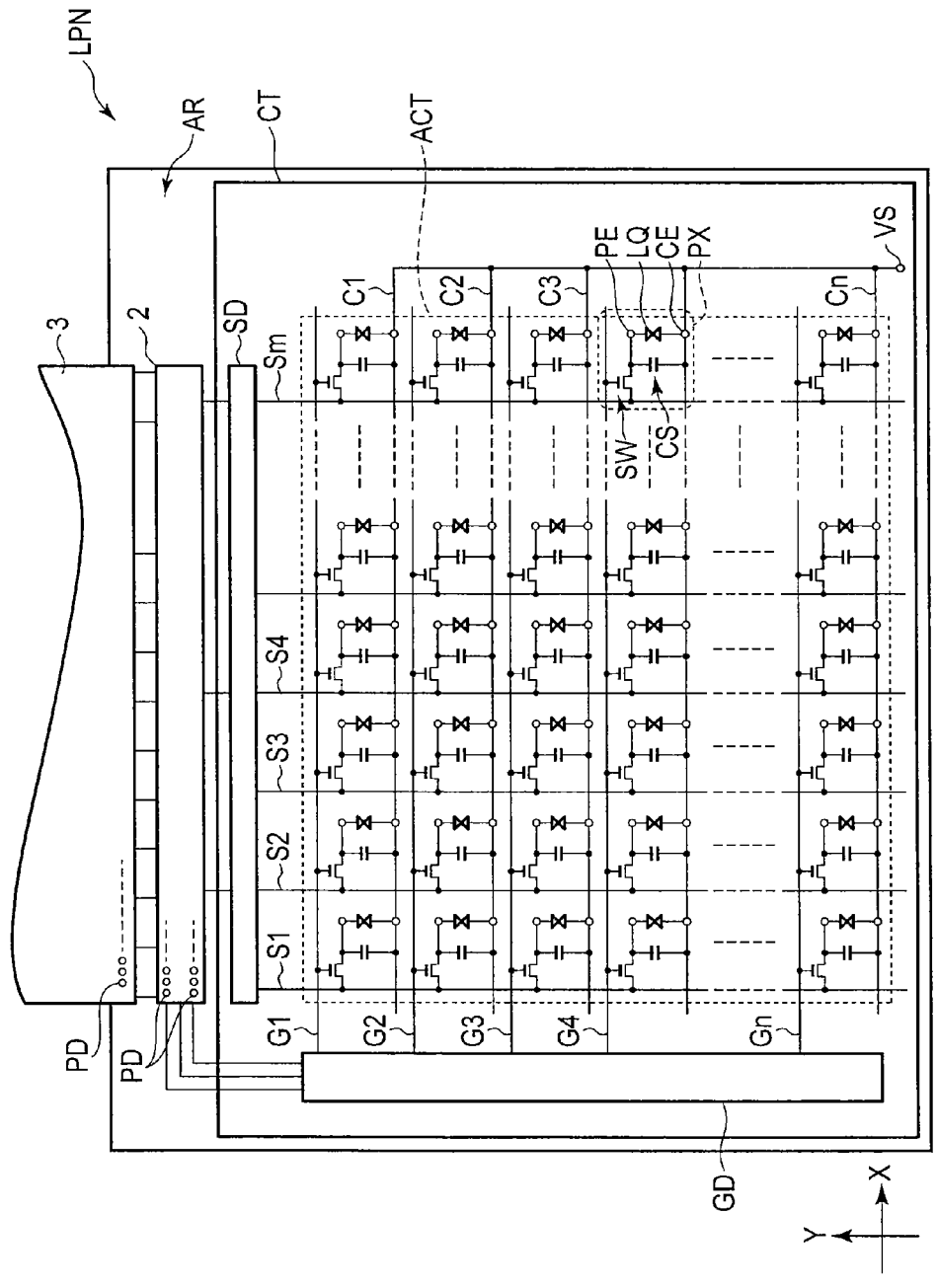
F I G. 1

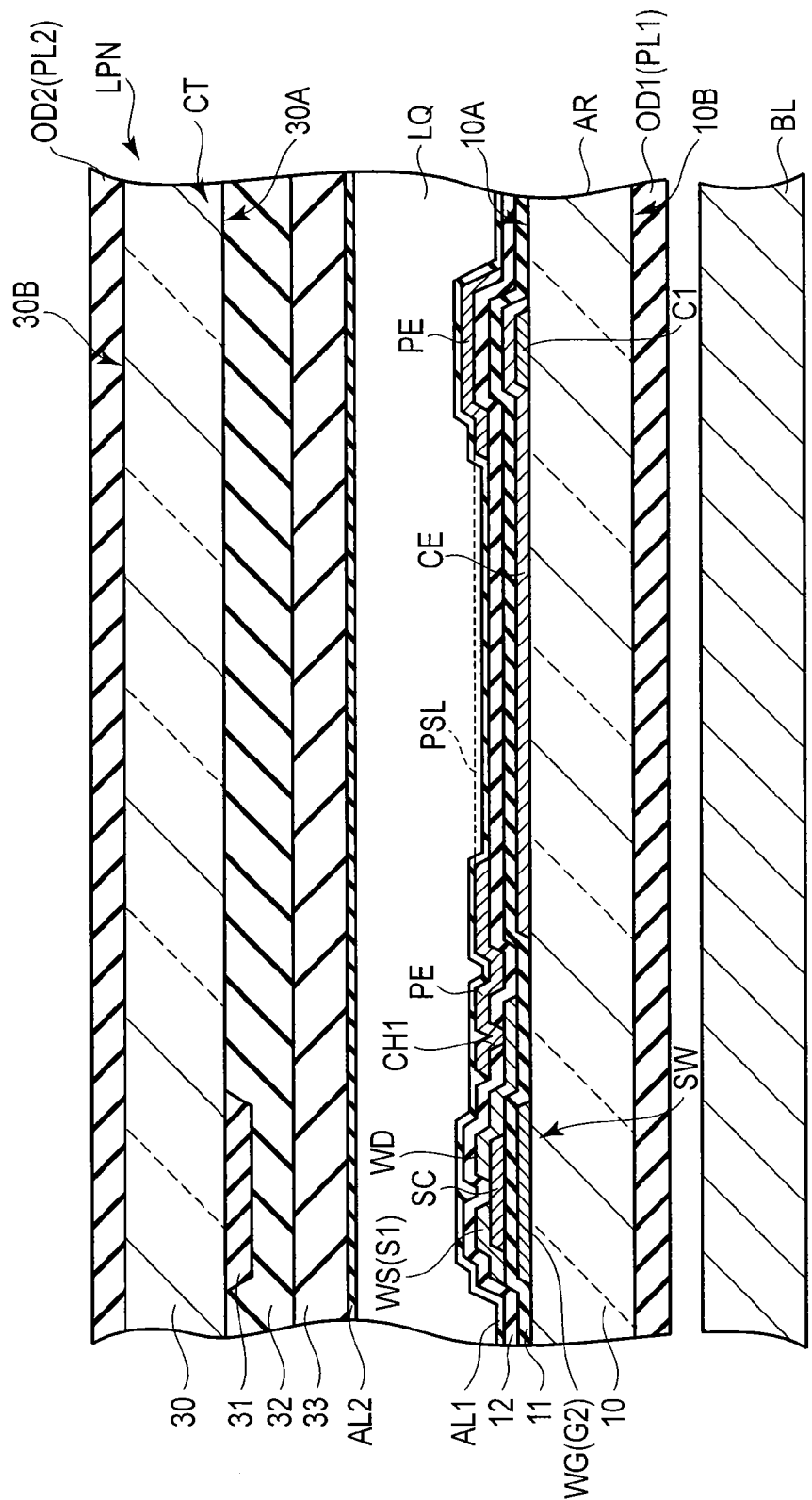
F I G. 3

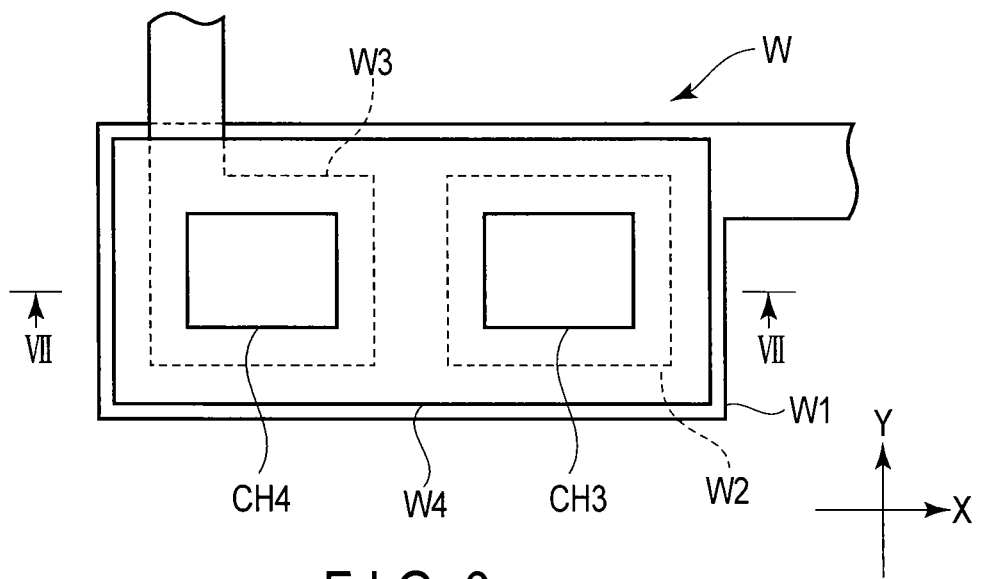
F I G. 6
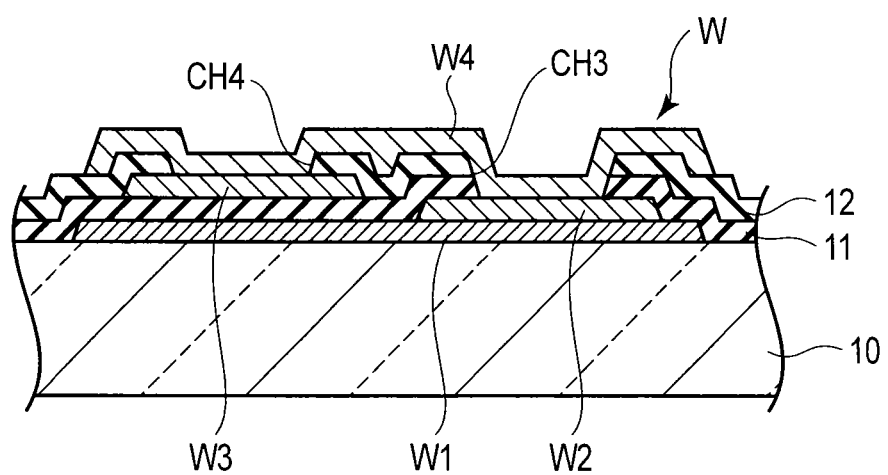
F I G. 7

LIQUID CRYSTAL DISPLAY DEVICE

CROSS-REFERENCE TO RELATED APPLICATIONS

This application is based upon and claims the benefit of priority from Japanese Patent Application No. 2012-014144, filed Jan. 26, 2012, the entire contents of which are incorporated herein by reference.

FIELD

Embodiments described herein relate generally to a liquid crystal display device.

BACKGROUND

By virtue of such advantageous features as light weight, small thickness and low power consumption, liquid crystal display devices have been used in various fields as display devices of OA equipment, such as personal computers, and TVs. In recent years, liquid crystal display devices have also been used as display devices of portable terminal equipment such as mobile phones, car navigation apparatuses, game machines, etc.

In recent years, liquid crystal display panels of a fringe field switching (FFS) mode and in-plane switching (IPS) mode have been put to practical use. The liquid crystal display panel of the FFS mode or IPS mode is configured such that a liquid crystal layer is held between an array substrate, which includes a pixel electrode and a common electrode, and a counter-substrate. The pixel electrode is electrically connected to, for example, a pad electrode via a contact hole formed in an insulation film.

When a lower-layer electrode and an upper-layer electrode, as described above, are electrically connected, there may be a case in which impurities adhere to, or an oxide film forms on, the surface of the lower-layer electrode, as an exposure time of the lower-layer electrode becomes longer during a period from formation of a contact hole, which exposes the lower-layer electrode, to formation of the upper-layer electrode. Consequently, a resistive layer lies between the lower-layer electrode and the upper-layer electrode.

Compared to a gate driver or a source driver, a system driver which controls logic outputs needs to be supplied with a large current, and a variance in resistance needs to be suppressed when the system driver is mounted. If the above-described structure is applied to pads at a time of mounting the system driver, the variance in resistance increases between the pads due to the presence of the resistive layer, and there is concern that malfunction of the system driver occurs or a display defect occurs due to a difference between wiring resistances.

BRIEF DESCRIPTION OF THE DRAWINGS

FIG. 1 is a view which schematically illustrates a structure and an equivalent circuit of a liquid crystal display panel which constitutes a liquid crystal display device according to an embodiment.

FIG. 3 is a cross-sectional view which schematically shows a cross-sectional structure of the liquid crystal display panel at a time when the pixel PX shown in FIG. 2 is cut along line III-III.

FIG. 6 is a plan view illustrating a wiring switching part which is applicable to the liquid crystal display device of the embodiment.

FIG. 7 is a cross-sectional view taken along line VII-VII in FIG. 6, which schematically shows a cross-sectional structure of the wiring switching part shown in FIG. 6.

DETAILED DESCRIPTION

Figure 2:
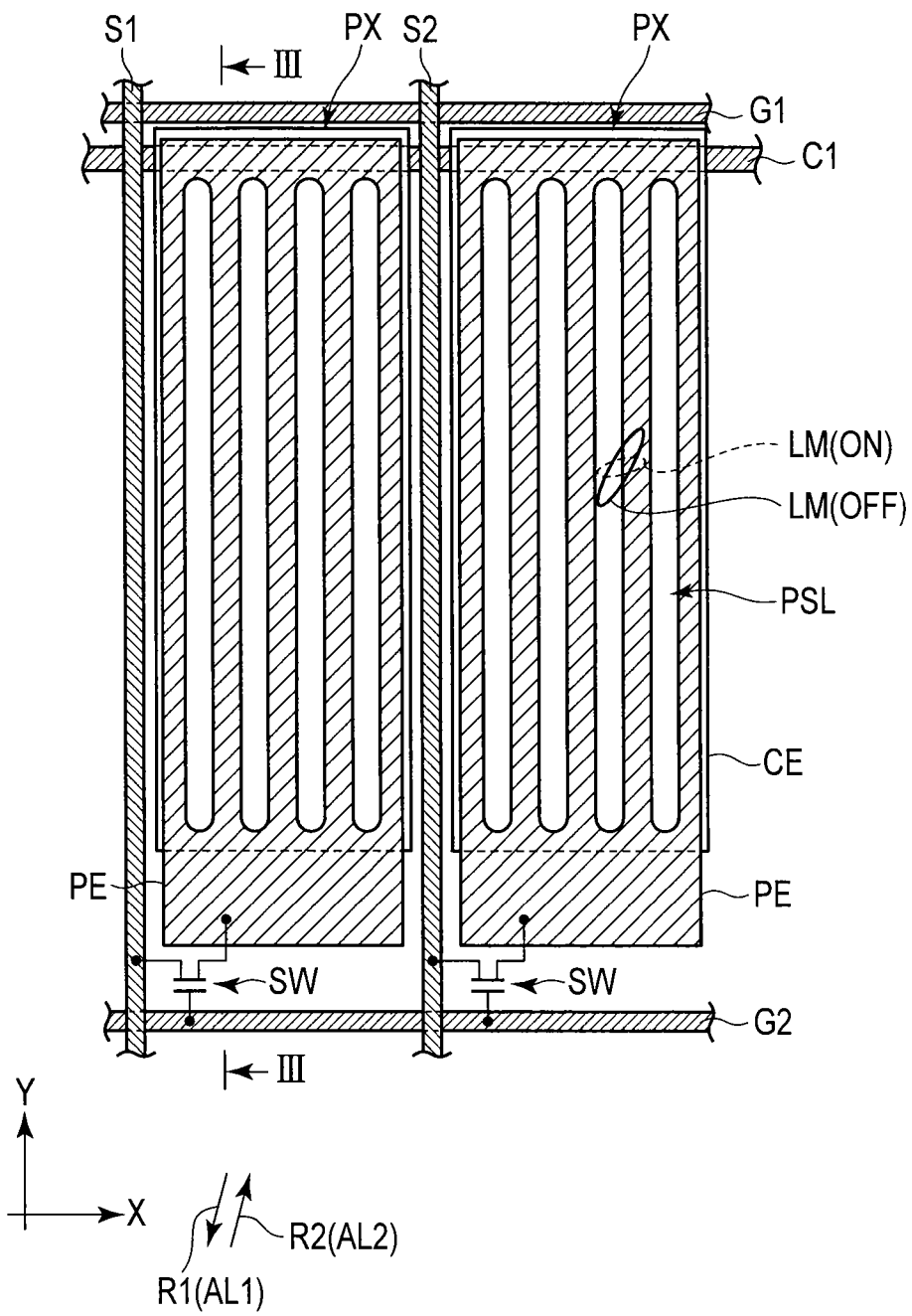
FIG. 2 is a schematic plan view which illustrates a structure of a pixel in an array substrate shown in FIG. 1, as viewed from a counter-substrate side.

In general, according to one embodiment, a liquid crystal display device includes a first substrate including an insulative substrate, a first electrically conductive layer, a second electrically conductive layer, a first insulation film, a third electrically conductive layer, a second insulation film, a fourth electrically conductive layer and a first alignment film, the first electrically conductive layer including a gate line located on an inner surface of the insulative substrate, a common potential line and a first pad portion, the second electrically conductive layer including a common electrode which is located on the inner surface of the insulative substrate and is put in contact with the common potential line, and a second pad portion stacked on the first pad portion, the first insulation film covering the first electrically conductive layer and the second electrically conductive layer, the third electrically conductive layer including a source line located on the first insulation film, the second insulation film covering the third electrically conductive layer and the first insulation film, the fourth electrically conductive layer including a pixel electrode which is located in each of pixels on the second insulation film and in which a slit facing the common electrode is formed, and a third pad portion which is put in contact with the second pad portion via a first contact hole penetrating through the first insulation film and the second insulation film to the second pad portion, and the first alignment film covering the pixel electrode and the second insulation film; a second substrate including a second alignment film which is opposed to the first alignment film; and a liquid crystal layer held between the first alignment film and the second alignment film.

Embodiments will now be described in detail with reference to the accompanying drawings. In the drawings, structural elements having the same or similar functions are denoted by like reference numerals, and an overlapping description is omitted.

FIG. 1 is a view which schematically shows a structure and an equivalent circuit of a liquid crystal display panel LPN which constitutes a liquid crystal display device according to an embodiment.

Specifically, the liquid crystal display device includes a transmissive liquid crystal display panel LPN of an active matrix type. The liquid crystal display panel LPN includes an array substrate AR which is a first substrate, a counter-substrate CT which is a second substrate that is disposed to be opposed to the array substrate AR, and a liquid crystal layer LQ which is held between the array substrate AR and the counter-substrate CT. The liquid crystal display panel LPN includes an active area ACT which displays an image.

The active area ACT is composed of a plurality of pixels PX which are arrayed in a matrix of m×n (m and n are positive integers).

The array substrate AR includes, in the active area ACT, an n-number of gate lines G (G1 to Gn) and an n-number of common potential lines C (C1 to Cn), which extend in a first direction X, an m-number of source lines S (S1 to Sm) which extend in a second direction Y crossing the first direction X, a switching element SW which is electrically connected to the gate line G and source line S in each pixel PX, a pixel electrode PE which is electrically connected to the switching element SW in each pixel PX, and a common electrode CE which is opposed to the pixel electrode PE. The common electrode CE is electrically connected to the common potential line C.

Each of the gate lines G is led out of the active area ACT and is connected to a gate driver GD. Each of the source lines S is led out of the active area ACT and is connected to a source driver SD. Each of the common potential lines C is led out of the active area ACT and is connected to a power supply module VS to which a common voltage is supplied. For example, at least parts of the gate driver GD and source driver SD are formed on the array substrate AR and are connected to a driving IC chip 2. In the example illustrated, the driving IC chip 2, which functions as a signal supply source for supplying signals that are necessary for driving the liquid crystal display panel LPN, incorporates a system driver which controls logic outputs. The driving IC chip 2 is mounted on the array substrate AR, on the outside of the active area ACT of the liquid crystal display panel LPN. In addition, a flexible printed circuit board (FPC), which functions as a signal supply source, is mounted at an end portion of the array substrate AR. The array substrate AR includes a plurality of pads PD for mounting these signal supply sources.

Besides, the liquid crystal display panel LPN of the illustrated example is configured to be applicable to an FFS mode or an IPS mode, and includes the pixel electrode PE and common electrode CE on the array substrate AR. In the liquid crystal display panel LPN with this structure, liquid crystal molecules, which constitute the liquid crystal layer LQ, are switched by mainly using a lateral electric field which is produced between the pixel electrode PE and common electrode CE (e.g. that part of a fringe electric field, which is substantially parallel to a major surface of the substrate).

FIG. 2 is a schematic plan view which illustrates the structure of the pixel PX in the array substrate AR shown in FIG. 1, as viewed from the counter-substrate CT side. FIG. 2 shows only main parts which are necessary for the description.

A gate line G1 and a gate line G2 extend in the first direction X. The gate line G1 and gate line G2 are disposed with a first pitch along the second direction Y. A common potential line C1 extends in the first direction X between the gate line G1 and gate line G2. A source line S1 and a source line S2 extend in the second direction Y. The source line S1 and a source line S2 are disposed with a second pitch, which is less than the first pitch, along the first direction X.

A pixel PX, which is defined by the gate line G1, gate line G2, source line S1 and source line S2, has a vertically elongated rectangular shape having a less length in the first direction X than in the second direction Y. Specifically, the length of the pixel PX in the second direction corresponds to the first pitch between the gate lines, and the length of the pixel PX in the first direction X corresponds to the second pitch between the source lines.

A switching element SW of the pixel PX on the left side in FIG. 2 is disposed near an intersection between the gate line G2 and the source line S1, and is electrically connected to the gate line G2 and the source line S1. Similarly, a switching element SW of the pixel PX on the right side in FIG. 2 is disposed near an intersection between the gate line G2 and the source line S2, and is electrically connected to the gate line G2 and the source line S2.

A common electrode CE is formed, for example, in an island shape in each pixel PX. In the example illustrated, the common electrode CE is formed in a vertically elongated rectangular shape which corresponds to the shape of the pixel PX. A part of the common electrode CE is put in contact with, and electrically connected to, the common potential line C1. A pixel electrode PE is formed in an island shape in each pixel PX, and is opposed to the common electrode CE via an insulation film. In the example illustrated, the pixel electrode PE is formed in a vertically elongated rectangular shape which corresponds to the shape of the pixel PX. The pixel electrode PE is electrically connected to the switching element SW.

A plurality of slits PSL, which are opposed to the common electrode CE, are formed in the pixel electrode PE. Specifically, each of the slits PSL is located above the common electrode CE. In the example illustrated, each of the slits PSL extends in the second direction Y and has a major axis which is parallel to the second direction Y. In the meantime, the slit PSL may be formed to have a major axis which is parallel to the first direction X, or may be formed to have a major axis which is parallel to a direction crossing the first direction X and second direction Y, or may be formed to have a bent shape like an angle bracket (<) shape.

FIG. 3 is a cross-sectional view which schematically shows a cross-sectional structure of the liquid crystal display panel LPN at a time when the pixel PX shown in FIG. 2 is cut along line III-III.

Specifically, the array substrate AR is formed by using a first insulative substrate 10 with light transmissivity, such as a glass substrate. The array substrate AR includes the switching element SW, common electrode CE and pixel electrode PE on an inner surface 10A of the first insulative substrate 10 (i.e. that surface of the first insulative substrate 10, which is opposed to the counter-substrate CT).

The switching element SW illustrated in this example is, for instance, a thin-film transistor (TFT). The switching element SW includes a semiconductor layer which is formed of, e.g. amorphous silicon. In the meantime, the switching element SW may be of a top gate type or a bottom gate type. In the example illustrated, the switching element SW of the bottom gate type is adopted.

Specifically, a gate electrode WG of the switching element SW is formed on the inner surface 10A of the first insulative substrate 10. The gate electrode WG is electrically connected to the gate line G2. In the example illustrated, the gate electrode WG is formed integral with the gate line G2. Similarly, the gate line G2, which is shown, and other gate lines are formed on the inner surface 10A of the first insulative substrate 10. In addition, the common potential line C1, which is shown, and other common potential lines are formed on the inner surface 10A of the first insulative substrate 10. These gate lines and common potential lines are formed in the same fabrication step by using the same wiring material.

The common electrode CE is formed on the inner surface 10A of the first insulative substrate 10. A part of the common electrode CE extends over the common potential line C1 and comes in contact with the common potential line C1. The common electrode CE is located between neighboring gate lines and is not in contact with any of the gate lines. The common electrode CE is formed of a transparent, electrically conductive material, for instance, an electrically conductive oxide such as indium tin oxide (ITO) or indium zinc oxide (IZO).

The gate line, common potential line and common electrode CE are covered with a first insulation film 11. In addition, the first insulation film 11 is also disposed on the inner surface 10A of the first insulative substrate 10

A semiconductor layer SC of the switching element SW is formed on the first insulation film 11 and is located above the gate electrode WG.

A source electrode WS and a drain electrode WD of the switching element SW are formed on the first insulation film 11 and are put in contact with the semiconductor layer SC. The source electrode WS is electrically connected to the source line S1. In the example illustrated, the source electrode WS is formed integral with the source line S1. Similarly, the source line S1, which is shown, and other source lines are formed on the first insulation film 11.

The gate line G including the gate electrode WG, the common potential line C, the source line S including the source electrode WS, and the drain electrode WD are formed of an opaque wiring material, for example, any one of metallic materials such as aluminum (Al), titanium (Ti), silver (Ag), molybdenum (Mo), tungsten (W), copper (Cu) and chromium (Cr), or an alloy including any one of these metallic materials.

The switching element SW with this structure and the source line are covered with a second insulation film 12. In addition, the second insulation film 12 is also disposed on the first insulation film 11. A contact hole CH1, which penetrates to the drain electrode WD, is formed in the second insulation film 12. The first insulation film 11 and second insulation film 12 are formed of an inorganic compound such as silicon nitride (SiN).

The pixel electrode PE is formed on the second insulation film 12 and is opposed to the common electrode CE. The first insulation film 11 and second insulation film 12 are interposed between the pixel electrode PE and common electrode CE. The pixel electrode PE is electrically connected to the drain electrode WD of the switching element SW via the contact hole CH1 which penetrates the second insulation film 12. In addition, a slit PSL, which penetrates to the second insulation film 12, is formed in the pixel electrode PE. The slit PSL is located above the common electrode CE. The pixel electrode PE is formed of a transparent, electrically conductive material such as ITO or IZO.

The pixel electrode PE is covered with a first alignment film AL1. The first alignment film AL1 also covers the second insulation film 12. The first alignment film AL1 is formed of a material which exhibits horizontal alignment properties, and is disposed on that surface of the array substrate AR, which is in contact with the liquid crystal layer LQ.

On the other hand, the counter-substrate CT is formed by using a second insulative substrate 30 with light transmissivity, such as a glass substrate. The counter-substrate CT includes a black matrix 31 which partitions pixels PX, color filters 32 and an overcoat layer 33 on an inner surface 30A of the second insulative substrate 30 (i.e. on that side of the second insulative substrate 30, which is opposed to the array substrate AR).

The black matrix 31 is formed on the inner surface 30A of the second insulative substrate 30 so as to be opposed to wiring portions, such as gate lines G, source lines G and switching elements SW, which are provided on the array substrate AR.

The color filters 32 are formed on the inner surface 30A of the second insulative substrate 30, and also extend over the black matrix 31. The color filters 32 are formed of resin materials which are colored in mutually different colors, e.g. three primary colors of red, blue and green. Boundaries between the color filters 32 of different colors are located on the black matrix 31.

The overcoat layer 33 covers the color filters 32. The overcoat layer 33 planarizes asperities on the surface of the black matrix 31 and color filters 32. The overcoat layer 33 is formed of a transparent resin material. The overcoat layer 33 is covered with a second alignment film AL2. The second alignment film AL2 is formed of a material which exhibits horizontal alignment properties, and is disposed on that surface of the counter-substrate CT, which is in contact with the liquid crystal layer LQ.

The above-described array substrate AR and counter-substrate CT are disposed such that their first alignment film AL1 and second alignment film AL2 are opposed to each other. In this case, a columnar spacer, which is formed on one of the array substrate AR and counter-substrate CT, creates a predetermined cell gap between the array substrate AR and the counter-substrate CT. The array substrate AR and counter-substrate CT are attached by a sealant in the state in which the cell gap is created therebetween. The liquid crystal layer LQ is composed of a liquid crystal composition including liquid crystal molecules LM which are sealed in the cell gap created between the first alignment film AL1 of the array substrate AR and the second alignment film AL2 of the counter-substrate CT.

A backlight BL is disposed on the back side of the liquid crystal display panel LPN having the above-described structure. Various modes are applicable to the backlight BL. As the backlight BL, use may be made of either a backlight which utilizes a light-emitting diode (LED) as a light source, or a backlight which utilizes a cold cathode fluorescent lamp (CCFL) as a light source. A description of the detailed structure of the backlight BL is omitted.

A first optical element OD1 including a first polarizer PL1 is disposed on an outer surface of the array substrate AR, that is, an outer surface 10B of the first insulative substrate 10. In addition, a second optical element OD2 including a second polarizer PL2 is disposed on an outer surface of the counter-substrate CT, that is, an outer surface 30B of the second insulative substrate 30. A first polarization axis (or a first absorption axis) of the first polarizer PL1 and a second polarization axis (or a second absorption axis) of the second polarizer PL2 are disposed, for example, in a positional relationship of crossed Nicols.

The first alignment film AL1 and second alignment film AL2 are subjected to alignment treatment (e.g. rubbing treatment or optical alignment treatment) in mutually parallel directions in a plane parallel to substrate major surfaces (or an X-Y plane), as illustrated in FIG. 2. The first alignment film AL1 is subjected to alignment treatment in a direction crossing the major axis (second direction Y in the example of FIG. 2) of the slit PSL at an acute angle of 45° or less. An alignment treatment direction R1 of the first alignment film AL1 is, for example, a direction which crosses, at an angle of 5° to 15°, the second direction Y in which the slit PSL extends. In addition, the second alignment film AL2 is subjected to alignment treatment in a direction which is parallel to the alignment treatment direction R1 of the first alignment film AL1. The alignment treatment direction R1 of the first alignment film AL1 and an alignment treatment direction R2 of the second alignment film AL2 are opposite to each other.

In the meantime, in this case, the first polarization axis of the first polarizer PL1 is set to be, for example, substantially parallel to the alignment treatment direction R1 of the first alignment film AL1, and the second polarization axis of the second polarizer PL2 is set to be substantially perpendicular to the alignment treatment direction R1 of the first alignment film AL1, Next, the operation of the liquid crystal display device with the above-described structure is described.

At an OFF time when such a voltage as to produce a potential difference is not applied between the pixel electrode PE and common electrode CE, no voltage is applied to the liquid crystal layer LQ, and no electric field is produced between the pixel electrode PE and common electrode CE. Thus, liquid crystal molecules LM included in the liquid crystal layer LQ are initially aligned, as indicated by a solid line in FIG. 2, in the alignment treatment directions (R1 and R2) of the first alignment film AL1 and second alignment film AL2 in the X-Y plane (the direction in which the liquid crystal molecules LM are initially aligned is referred to as "initial alignment direction").

At the OFF time, part of light from the backlight BL passes through the first polarizer PL1 and enters the liquid crystal display panel LPN. The light, which enters the liquid crystal display panel LPN, is linearly polarized light which is perpendicular to the first polarization axis of the first polarizer PL1. The polarization state of such linearly polarized light hardly varies when the light passes through the liquid crystal display panel LPN at the OFF time. Thus, the linearly polarized light, which has passed through the liquid crystal display panel LPN, is absorbed by the second polarizer PL2 that is in the positional relationship of crossed Nicols in relation to the first polarizer PL1 (black display).

On the other hand, at an ON time when such a voltage as to produce a potential difference is applied between the pixel electrode PE and common electrode CE, a voltage is applied to the liquid crystal layer LQ, and a fringe electric field is produced between the pixel electrode PE and common electrode CE. Thus, the liquid crystal molecules LM are aligned in a direction different from the initial alignment direction in the X-Y plane, as indicated by a broken line in FIG. 2. In the case of a positive-type liquid crystal material, the liquid crystal molecules LM are aligned in a direction which is substantially parallel to the electric field (i.e. a direction substantially perpendicular to the major axis of the slit PSL).

At the ON time, linearly polarized light, which is perpendicular to the first polarization axis of the first polarizer PL1, enters the liquid crystal display panel LPN, and the polarization state of such linearly polarized light varies depending on the alignment state of the liquid crystal molecules LM when the light passes through the liquid crystal layer LQ. Thus, at the ON time, at least part of the light emerging from the liquid crystal layer LQ passes through the second polarizer PL2 (white display).

Next, a concrete structure of the pad PD, on which the signal supply source is mounted, is described.

Figure 4:
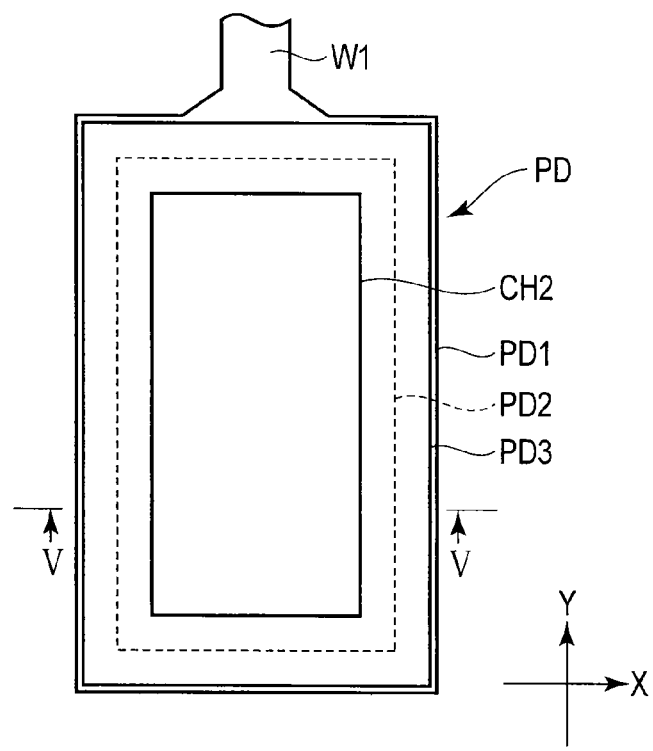
FIG. 4 is a plan view illustrating a pad which is applicable to the liquid crystal display device of the embodiment.
Figure 5:
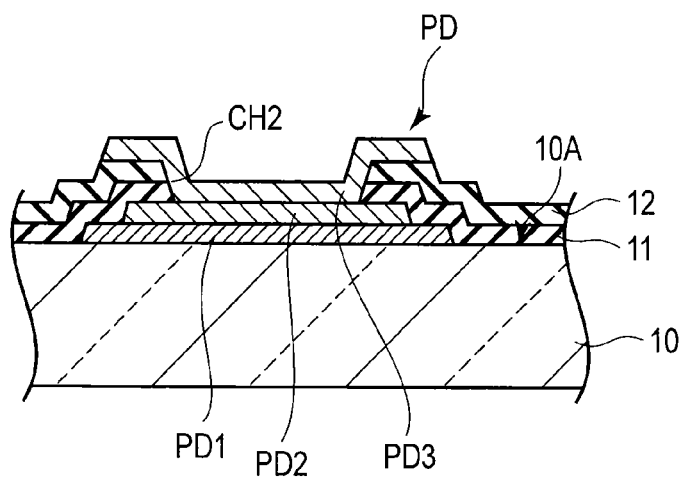
FIG. 5 is a cross-sectional view taken along line V-V in FIG. 4, which schematically shows a cross-sectional structure of the pad shown in FIG. 4.

FIG. 4 is a plan view illustrating a pad PD which is applicable to the liquid crystal display device of the embodiment. FIG. 5 is a cross-sectional view taken along line V-V in FIG. 4, which schematically shows a cross-sectional structure of the pad PD shown in FIG. 4.

The pad PD is formed of a multilayer structure in which a first pad portion PD1, a second pad portion PD2 and a third pad portion PD3 are stacked.

The first pad portion PD1 is formed on the inner surface 10A of the first insulative substrate 10. The first pad portion PD1 is formed integral or continuous with a first wiring portion W1 for supplying a signal from the signal supply source. The second pad portion PD2 is stacked on the first pad portion PD1. Specifically, the second pad PD2 is formed in an island shape on the first pad portion PD1, and is put in contact with the first pad portion PD1.

A contact hole CH2, which penetrates to the second pad portion PD2, is formed in the first insulation film 11 and second insulation film 12. Specifically, in the plan view of the X-Y plane in FIG. 4, the outside shape of the contact hole CH2 is smaller than the outside shape of the first pad portion PD1 and that of the second pad portion PD2, and the edges of the first pad portion PD1 and the edges of the second pad portion PD2 are entirely covered with the first insulation film 11. Thus, only the central part of the second pad portion PD2 is exposed from the contact hole CH2, and the first pad portion PD1 is not exposed from the contact hole CH2.

The third pad portion PD3 is formed in an island shape on the second insulation film 12 and is put in contact with the second pad portion PD2 via the contact hole CH2. The outside shape of the third pad portion PD3 is substantially equal to the outside shape of the first pad portion PD1. The third pad portion PD3 is electrically connected to the signal supply source that is mounted.

Next, a concrete structure of a wiring switching part W is described.

FIG. 6 is a plan view illustrating a wiring switching part which is applicable to the liquid crystal display device of the embodiment. FIG. 7 is a cross-sectional view taken along line VII-VII in FIG. 6, which schematically shows a cross-sectional structure of the wiring switching part shown in FIG. 6.

The wiring switching part W is composed of a first wiring portion W1, a second wiring portion W2, a third wiring portion W3 and a fourth wiring portion W4.

The first wiring portion W1 is formed on the inner surface 10A of the first insulative substrate 10. In the Figures, a part of the first wiring portion W1, which is located at the wiring switching part W, is illustrated. The second wiring portion W2 is stacked on the first wiring portion W1. Specifically, the second wiring portion W2 is formed in an island shape on the first wiring portion W1 and is put in contact with the first wiring portion W1. In addition, the second wiring portion W2 is spaced apart from the second pad portion PD2.

A contact hole CH3, which penetrates to the second wiring portion W2, is formed in the first insulation film 11 and second insulation film 12. Specifically, in the plan view of the X-Y plane in FIG. 6, the outside shape of the contact hole CH3 is smaller than the outside shape of the second wiring portion W2, and the edges of the first wiring portion W1 and the edges of the second wiring portion W2 are entirely covered with the first insulation film 11. Thus, only the central part of the second wiring portion W2 is exposed from the contact hole CH3, and the first wiring portion W1 is not exposed from the contact hole CH3.

The third wiring portion W3 is formed on the first insulation film 11. The Figures illustrate a part of the third wiring portion W3, which is located at the wiring switching part W, that is, a part of the third wiring portion W3, which extends immediately above the first wiring portion W1 via the first insulation film 11. The first insulation film 11 lies between the third wiring portion W3, on the one hand, and the first wiring portion W1 and second wiring portion W2, on the other hand. Thus, the third wiring portion W3 is not in contact with the first wiring portion W1 or second wiring portion W2.

A contact hole CH4, which penetrates to the third wiring portion W3, is formed in the second insulation film 12. Specifically, in the plan view of the X-Y plane in FIG. 6, the outside shape of the contact hole CH4 is smaller than the outside shape of the third wiring portion W3, and the edges of the third wiring portion W3 are entirely covered with the second insulation film 12. Thus, only the central part of the third wiring portion W3 is exposed from the contact hole CH4.

The fourth wiring portion W4 is formed in an island shape on the second insulation film 12 and is put in contact with the second wiring portion W2 via the contact hole CH3. In addition, the fourth wiring portion W4 is put in contact with the third wiring portion W3 via the contact hole CH4. Thereby, the fourth wiring portion W4 electrically connects the second wiring portion W2 and third wiring portion W3.

The liquid crystal display device with the above-described structure is fabricated, for example, by the following steps.

To start with, a film of a wiring material is formed on the inner surface 10A of the first insulative substrate 10 and is patterned. Thereby, the gate line G, common potential line C, first pad portion PD1 and first wiring portion W1 are formed at a time. Specifically, the gate electrode WG, gate line G, common potential line C, first pad portion PD1 and first wiring portion W1 are included in a first electrically conductive layer which is formed in the same step by using the same wiring material.

Subsequently, a film of a transparent, electrically conductive material is formed on the inner surface 10A of the first insulative substrate 10 and is patterned. Thereby, the common electrode CE which is in contact with the common potential line C, the second pad portion PD2 which is in contact with the first pad portion PD1, and the second wiring portion W2, which is in contact with the first wiring portion W1, are formed at a time. Specifically, the common electrode CE, second pad portion PD2 and second wiring portion W2 are included in a second electrically conductive layer which is formed in the same step by using the same wiring material.

Thereafter, the first insulation film 11, which covers the first electrically conductive layer and second electrically conductive layer, is formed. Then, a film of a wiring material is formed on the first insulation film 11 and is patterned. Thereby, the source line S and third wiring portion W3 are formed at a time. Specifically, the source electrode WS, drain electrode WD, source line S and third wiring portion W3 are included in a third electrically conductive layer which is formed in the same step by using the same wiring material.

Following the above, the second insulation film 12, which covers the third electrically conductive layer and the first insulation film, is formed. Then, the contact hole CH1 which penetrates through the second insulation film 12 to the drain electrode, the contact hole CH2 which penetrates through the first insulation film 11 and second insulation film 12 to the second pad portion PD2, the contact hole CH3 which penetrates through the first insulation film 11 and second insulation film 12 to the second wiring portion W2, and the contact hole CH4 which penetrates through the second insulation film 12 to the third wiring portion W3, are formed at a time.

Subsequently, a film of a transparent, electrically conductive material is formed on the second insulation film 12 and is patterned. Thereby, the pixel electrode PE which is in contact with the drain electrode WD, the third pad portion PD3 which is in contact with the second pad portion PD2, and the fourth wiring portion W4 which is in contact with the second wiring portion W2 and third wiring portion W3, are formed at a time. Specifically, the pixel electrode PE, third pad portion PD3 and fourth wiring portion W4 are included in a fourth electrically conductive layer which is formed in the same step by using the same wiring material.

According to this embodiment, in the pad PD, the first pad portion PD1, which is formed of the wiring material, is not exposed from the contact hole CH2, and the second pad portion PD2, which is formed of an electrically conductive oxide and is stacked on the first pad portion PD1, is exposed from the contact hole CH2. Specifically, in the contact hole CH2, the first pad portion PD1 is capped by the second pad portion PD2. Thus, it is possible to prevent impurities from adhering to the surface of the first pad portion PD1, or to prevent an oxide film from forming on the surface of the first pad portion PD1. To be more specific, when the contact hole CH2 is formed, the first pad portion PD1 is not damaged, no oxide film is formed on the surface of the first pad portion PD1, and no impurities, such as residues, adhere to the surface of the first pad portion PD1.

Thus, it is possible to suppress an increase in resistance value between the second pad portion PD2 and the third pad portion PD3 that is in contact with the second pad portion PD2. Thereby, in the driving IC chip incorporating a signal supply source, in particular, a system driver, which is mounted on pads PD, the variance in resistance can be reduced among the pads on which the signal supply source is mounted, and the occurrence of malfunction can be suppressed. Therefore, the display quality can be improved.

In addition, there is no need to perform chemical washing for removing polymeric impurities, or an impurity removing process, such as reverse sputtering, for removing impurities. Therefore, the fabrication steps can be simplified, the cost for the fabrication steps can be reduced, equipment investment that is necessary for the impurity removing process is made needless, and cost reduction can be realized.

Furthermore, in the present embodiment, in the wiring switching part W, too, the first wiring portion W1 which is formed of the wiring material is not exposed from the contact hole CH3, and the second wiring portion W2, which is formed of an electrically conductive oxide and is stacked on the first wiring portion W1, is exposed from the contact hole CH3. Specifically, in the contact hole CH3, the first wiring portion W1 is capped by the second wiring portion W2. Thus, it is possible to prevent impurities from adhering to the surface of the first wiring portion W1, or to prevent an oxide film from forming on the surface of the first wiring portion W1. Thereby, it is possible to suppress an increase in resistance value between the second wiring portion W2 and the fourth wiring portion W4 that is in contact with the second wiring portion W2.

In the above-described embodiment, the second pad portion PD2 completely covers the first pad portion PD1 in the contact hole CH2, and the second wiring portion W2 completely covers the first wiring portion W1 in the contact hole CH3. However, the embodiment is not limited to this example.

For example, the second pad portion PD2 may be formed in such a slit shape or a grid shape as to expose a part of the first pad portion PD1 in the contact hole CH2. Similarly, the second wiring portion W2 may be formed in such a slit shape or a grid shape as to expose a part of the first wiring portion W1 in the contact hole CH3. Examples of the second pad portion PD2 will be described below.

Figure 8:
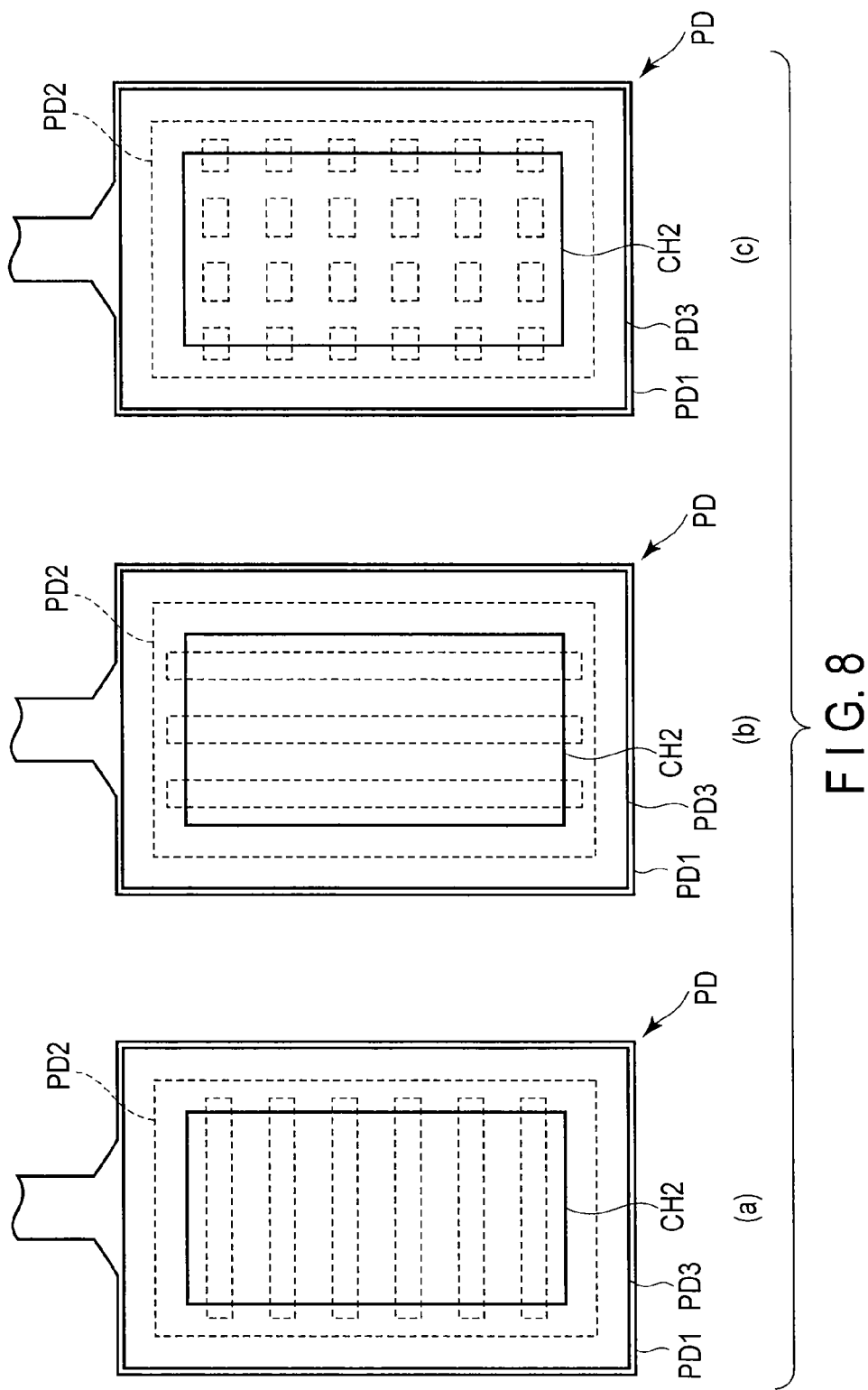
FIG. 8 illustrates plan views of other structure examples of a second pad portion.

FIG. 8 illustrates plan views of other structure examples of the second pad portion PD2.

A structure example illustrated in part (a) of FIG. 8 differs from the structure example illustrated in FIG. 4 in that the second pad portion PD2 is formed in a horizontal stripe shape. Specifically, a plurality of horizontally elongated opening portions are formed in the second pad portion PD2.

A structure example illustrated in part (b) of FIG. 8 differs from the structure example illustrated in FIG. 4 in that the second pad portion PD2 is formed in a vertical stripe shape. Specifically, a plurality of vertically elongated opening portions are formed in the second pad portion PD2.

A structure example illustrated in part (c) of FIG. 8 differs from the structure example illustrated in FIG. 4 in that the second pad portion PD2 is formed in a grid shape (or a mesh-like shape). Specifically, a plurality of opening portions, which are arrayed in a matrix, are formed in the second pad portion PD2.

In each of the structure examples shown in FIG. 8, the first pad portion PD1 is exposed from the opening portions of the second pad portion PD2. In the meantime, in order to reduce damage to the first pad portion PD1 or to suppress adhesion of impurities or formation of an oxide film, it is desirable to make as small as possible the area of exposure of the first pad portion PD1.

In such structure examples, the third pad portion PD3 which is disposed in the contact hole CH2 is, as a matter of course, in contact with the second pad portion PD2, and is also in contact with the first pad portion PD1 at openings in the second pad portion PD2. Therefore, the area of contact of the third pad portion PD3 with the lower-layer electrodes (first pad portion PD1 and second pad portion PD2) can be increased, and the adhesion of the third pad portion PD3 can be improved.

As has been described above, according to the present embodiment, a liquid crystal display device which can improve display quality can be provided. While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A liquid crystal display device comprising:
a first substrate including an insulative substrate, a first electrically conductive layer, a second electrically conductive layer, a first insulation film, a third electrically conductive layer, a second insulation film, a fourth electrically conductive layer and a first alignment film, the first electrically conductive layer including a gate line located on an inner surface of the insulative substrate, a common potential line and a first pad portion, the second electrically conductive layer including a common electrode which is located on the inner surface of the insulative substrate and is put in contact with the common potential line, and a second pad portion stacked on the first pad portion, the first insulation film covering the first electrically conductive layer and the second electrically conductive layer, the third electrically conductive layer including a source line located on the first insulation film, the second insulation film covering the third electrically conductive layer and the first insulation film, the fourth electrically conductive layer including a pixel electrode which is located on the second insulation film and in which a slit facing the common electrode is formed, and a third pad portion which is put in contact with the second pad portion via a first contact hole penetrating through the first insulation film and the second insulation film to the second pad portion, and the first alignment film covering the pixel electrode and the second insulation film;
a second substrate including a second alignment film which is opposed to the first alignment film; and
a liquid crystal layer held between the first alignment film and the second alignment film.

2. The liquid crystal display device of claim 1, wherein edges of the first pad portion and edges of the second pad portion are entirely covered with the first insulation film.

3. The liquid crystal display device of claim 1, wherein the second pad portion is formed in such a slit shape or a grid shape as to expose a part of the first pad portion in the first contact hole.

4. The liquid crystal display device of claim 1, further comprising a signal supply source mounted on the third pad portion.

5. The liquid crystal display device of claim 1, further comprising
a first wiring portion included in the first electrically conductive layer;
a second wiring portion having an island shape, the second wiring portion being included in the second electrically conductive layer and stacked on the first wiring portion;
a third wiring portion included in the third electrically conductive layer; and
a fourth wiring portion included in the fourth electrically conductive layer, put in contact with the second wiring portion via a second contact hole penetrating through the first insulation film and the second insulation film to the second wiring portion, and put in contact with the third wiring portion via a third contact hole penetrating through the second insulation film to the third wiring portion, the fourth wiring portion electrically connecting the second wiring portion and the third wiring portion.

6. The liquid crystal display device of claim 5, wherein edges of the first wiring portion and edges of the second wiring portion are entirely covered with the first insulation film.

7. The liquid crystal display device of claim 6, wherein edges of the third wiring portion are entirely covered with the second insulation film.

8. The liquid crystal display device of claim 5, wherein the first wiring portion is continuous with the first pad portion.

9. The liquid crystal display device of claim 5, wherein the second wiring portion is spaced apart from the second pad portion.

10. The liquid crystal display device of claim 5, wherein the second wiring portion is formed in such a slit shape or a grid shape as to expose a part of the first wiring portion in the second contact hole.

11. The liquid crystal display device of claim 5, wherein the second electrically conductive layer and the fourth electrically conductive layer are formed of a transparent, electrically conductive material.

12. The liquid crystal display device of claim 11, wherein the first electrically conductive layer and the third electrically conductive layer are formed of an opaque wiring material.

13. The liquid crystal display device of claim 12, wherein the first insulation film and the second insulation film are formed of an inorganic compound.

* * * * *